(12) United States Patent
Fournel et al.

(10) Patent No.: US 7,655,578 B2
(45) Date of Patent: Feb. 2, 2010

(54) METHOD FOR NANOSTRUCTURING OF THE SURFACE OF A SUBSTRATE

(75) Inventors: Frank Fournel, Villard Bonnot (FR); Jérôme Meziere, Grenoble (FR); Alexis Bavard, Grenoble (FR); Florent Pigeon, St Etienne (FR); Florence Garrelie, St Etienne (FR)

(73) Assignees: Commissariat a l'Energie Atomique, Paris (FR); Universite Jean Monnet, Saint Etienne (FR); Centre National de la Recherche Scientifique, Paris (FR)

( * ) Notice: Subject to any disclaimer, the term of this patent is extended or adjusted under 35 U.S.C. 154(b) by 215 days.

(21) Appl. No.: 11/773,082

(22) Filed: Jul. 3, 2007

(65) Prior Publication Data

US 2008/0280419 A1 Nov. 13, 2008

(30) Foreign Application Priority Data

Jul. 13, 2006 (FR) .................................. 06 52981

(51) Int. Cl.
*H01L 21/26* (2006.01)
(52) U.S. Cl. .................... 438/795; 438/455; 438/798; 257/E21.088
(58) Field of Classification Search ................ 438/455, 438/458, 473, 765, 771, 776, 795; 427/591, 427/592; 257/E21.088
See application file for complete search history.

(56) References Cited

U.S. PATENT DOCUMENTS 6,261,928 B1   7/2001  Bruel
6,831,017 B1 * 12/2004  Li et al. ....................... 438/694
7,041,227 B2   5/2006  Fournel et al.
7,229,897 B2   6/2007  Fournel et al.
7,276,424 B2 * 10/2007  Wei ............................ 438/406
7,452,790 B2 * 11/2008  Park et al. ................... 438/486

(Continued)

FOREIGN PATENT DOCUMENTS

FR       2 766 620  A1       1/1999

(Continued)

OTHER PUBLICATIONS

D. M. Lee, et al, "Impurity gettering by misfit dislocations in Si (2% Ge) epitaxy: nickel", Applied Physics Letters, XP000020101, vol. 53, No. 5, Aug. 1, 1988, pp. 370-372.

(Continued)

*Primary Examiner*—Alexander G Ghyka
*Assistant Examiner*—Stanetta D Isaac
(74) *Attorney, Agent, or Firm*—Oblon, Spivak, McClelland, Maier & Neustadt, L.L.P.

(57) ABSTRACT

Under consideration here is a method for the production of periodic nanostructuring on one of the surfaces of a substrate (10), presenting a periodic network of dislocations, embedded within a crystalline area (4) located in the neighborhood of an interface (5) between the crystalline material surfaces of two components (1, 2) assembled by bonding to form the substrate (10). It comprises the following steps:
- formation, in the dislocations (3), of implants (6) made of a material other than that of the crystalline area (4);
- irradiation of the substrate (10) with electromagnetic waves (11) in order to cause absorption of electromagnetic energy localized in the implants (6), this absorption leading to the appearance of the periodic nanostructuring (12) on the surface of the substrate (10).

29 Claims, 5 Drawing Sheets

U.S. PATENT DOCUMENTS

| | | | |
|---|---|---|---|
| 2005/0064343 A1* | 3/2005 | Romanato et al. | 430/312 |
| 2005/0229837 A1* | 10/2005 | Marty et al. | 117/2 |
| 2008/0268288 A1* | 10/2008 | Jin | 428/800 |
| 2008/0272396 A1* | 11/2008 | Fournel et al. | 257/190 |

FOREIGN PATENT DOCUMENTS

| | | |
|---|---|---|
| FR | 2 815 121 | 4/2002 |
| FR | 2 819 099 | 7/2002 |
| WO | WO 02/29876 A1 | 4/2002 |

OTHER PUBLICATIONS

J. M. Moison, et al., "Self organized growth of regular nanometer-scale InAs dots on GaAs", Applied Physics Letters, vol. 2, No. 64, Jan. 10, 1994, pp. 196-198.

L. Motte, et al., "Self-Organization into 2D and 3D Superlattices of Nanosized Particles Differing by Their Size", J. Phys. Chem B, No. 101, 1997, pp. 138-144.

Joy Y. Cheng, et al., "Templated Self-Assembly of Block Copolymers: Effect of Substrate Topography" Advanced Materials 2003, vol. 15, No. 19, Oct. 2, pp. 1599-1602.

G. Jin, et al, "Controlled arrangement of self-organized Ge islands on patterned Si (001) substrates", Applied Physics Letters, vol. 75, No. 18., Nov. 1, 1999, pp. 2752-2754.

Rikard A. Wind, et al., "Fabrication of nanoperiodic surface structures by controlled etching of dislocations in bicrystals", Applied Physics Letters, vol. 78, No. 15, Apr. 9, 2001, pp. 2205-2207.

* cited by examiner

METHOD FOR NANOSTRUCTURING OF THE SURFACE OF A SUBSTRATE

TECHNICAL FIELD

This invention relates to a method for nanostructuring of the surface of a substrate. Many applications in nanotechnology use orananised nanostructures, for example in microelectronics, optoelectronics or biology. These nanostructures are generally obtained by growth or by deposit on the surface of a substrate. An attempt is made to control the density and period of these nanostructures distributed on the surface of the substrate as precisely as possible.

STATE OF PRIOR ART

The obtaining of organised nanostructures obtained during the growth of nanoparticles on a substrate, for example by epitaxial growth is described, for example, in the article "Seld-Organized Growth of Regular Nanometer-Scale InAs on GsAs," J. M. Moison et al., Appl. Phys. Letter. No. 64 (2), 10 Jan. 1994, pages 196 to 198 or in the article "Self-Organization into 2D and 3D Superlattices of Nanosized Particles Differing by Their Size," L. Motte et al., Journal Phys. Chem. B1997, 101, pages 138 to 144. Unfortunately, in general, the spatial order obtained suffers from many structural flaws, in particular lacunae and disorientations. Other methods recommend prior creation of periodic nanostructuring of the surface of the reception substrate in order to optimise arrangement at the time of growth or deposit. This nanostructuring may be a pre-etching as described in the article "Controlled Arrangement of Self-Organized Ge Islands on Patterned Si(001) Substrates," G. Lin et al., Applied Physics Letters, vol. 75, No. 18, pages 2752 to 2754 or, for example, in the article "Templated Self-assembly of Block Copolymers Effect of Substrate Topography," Joy Y. Cheng et al., Advanced Materials 2003, 15, No. 19, October 2, pages 1599-1602. By periodic surface nanostructuring, we mean that periodic patterns are created on the nanometre scale on the surface of the reception substrate. The creation of pre-etching on the reception substrate is a simple means of controlling the spatial arrangement of the nanostructures at the time of the growth or deposit step. This pre-etching leads to a topographical nanostructuring of the starting substrate, i.e. a creation of periodic patterns in relief.

Numerous methods are known for doing this periodic surface nanostructuring. It is possible, for example, to use standard microelectronics techniques such as lithography and ionic etching. Unfortunately these methods take a long time and are difficult to use in industry for the etching of large surfaces on the order of a few square millimeters.

It is also known from patent applications FR-A-2 766 620 and FR-A-2 815 121 and from the article "Fabrication of Nanoperiodic Surface Structures by Controlled Etching of Dislocations in Bicrystals," Rikard A. Wind et al., Applied Physics Letters, volume 78, Number 15, 9 Apr. 2001, pages 2205 to 2207, a method which uses preferential etching of the crystalline flaws and/or fields of constraint of a network of dislocations in order to obtain this periodic surface nanostructuring. The network of dislocations is created by bonding, for example by molecular adhesion, a crystalline substrate with another crystalline substrate, more preferably the latter taking the form of a very thin crystalline film whose typical thickness is on the order of a few nanometers. The bonding is done in such a way as to obtain covalent bonds between the two crystalline networks of the surfaces to be assembled. An arrangement is obtained that is provided with a grain boundary at the bonding interface and this grain boundary thus causes the appearance of a network of dislocations of which the characteristics: orientation, period, type of dislocations and symmetry, depend only on the characteristics of the crystalline mesh of the substrate and the film, as well as the torsion and flexion disorientation angles introduced at the time of bonding. For example, starting with a film and a silicon substrate of which the surfaces to be assembled are oriented in the <001> direction, without flexion disorientation and with a torsion disorientation of 0.88°, a square network of dislocations referred to as screw dislocations is obtained, oriented according to the average <011> orientation of the two crystals that have been brought into play with a period of 25 nanometers. If the silicon film is sufficiently thin, for example of a thickness less than approximately 5 nanometers, the screw dislocation field spreads over the surface of the silicon film. It is then possible to preferentially etch the surface by using an etching means sensitive to the constraint fields. A periodic surface nanostructuring is then obtained of the arrangement obtained in relation to the underlying network of dislocations. We can be led to thin down the arrangement obtained in order to eliminate the network of dislocations at the end of the selective etching step. This topography can then by itself lead to the appearance of localised and periodic nucleation sites capable of serving as a base for the growth or deposit of nanostructures.

With the control of the bonding angles, the period of the network of dislocations is controlled and therefore the period of the nanostructuring. It is thus possible to adjust the distance between the nucleation sites and therefore the period and density of the nanostructures which are supported by said nucleation sites. This technique has the advantage of being rapid since the whole surface of the arrangement obtained by the bonding is selectively etched, this surface being able to correspond to that of a microelectronic substrate with, typically, a diameter of 300 millimeters. Its disadvantage is that the selective etching has the tendency of roughening the surface of the nucleation sites. This roughness is then very bothersome at the time of later growth or deposit of the nanostructures.

PRESENTATION OF THE INVENTION

This invention has precisely the purpose of proposing a method for periodic nanostructuring of the surface of a substrate which does not present the disadvantages mentioned above. More precisely, the method of the invention makes it possible to obtain, with great precision, a periodic network of structural patterns on the surface of the substrate. This network is easily created on large surfaces and the surface of the nucleation sites is as smooth as possible, which is favourable to the growth or deposit of nanostructures on the patterns.

To attain these goals, the invention more precisely relates to a method for the creation of periodic nanostructuring on one of the surfaces of a substrate presenting a periodic network of dislocations embedded within a crystalline area located in the neighbourhood of an interface between the crystalline material surfaces of two components assembled by bonding to form the substrate. It comprises the following steps:

- formation in the dislocations of implants in a material other than that of the crystalline area;
- irradiation of the substrate with electromagnetic waves in order to cause an absorption of electromagnetic energy localised in the implants, this absorption leading to the appearance of the periodic nanostructuring on the surface of the substrate.

The periodic nanostructuring is topographical or thermal.

By irradiating the substrate briefly, in such a way as to limit the thermal effects, it is possible to cause an ablation of at least a portion of the implants leading to an exfoliation of at least the crystalline material of the crystalline area facing the implants, between the implants and the surface of the substrate, this ablation and exfoliation contributing to the formation of the nanostructuring. In this context, brief irradiation means on the order of one or more femtoseconds.

As a variant, by irradiating the substrate in a more prolonged manner, it is possible to cause a temperature increase of the surface through thermal effects. This temperature increase may be inhomogeneous in the implants and in the crystalline area located between the implants. In this context, irradiation in a more prolonged way means on the order of one or a few picoseconds, or even on the order of one or a few nanoseconds.

The inhomogeneous temperature increase may lead to a plastic deformation or exfoliation of the crystalline material located facing the implants, between the implants and the surface of the substrate, the deformation or exfoliation contributing to the formation of the nanostructuring.

The temperature increase may lead to the appearance, on the surface of the substrate, of areas more thermally affected compared to the implants, these areas being hotter, these areas more thermally affected bordering areas less thermally affected, i.e. less hot, these areas more thermally affected and less thermally affected being able to form the nanostructuring.

It is possible to carry out a preferential attack on the areas more thermally affected vis-à-vis areas less thermally affected, in such a way as to obtain a topographical nanostructuring.

It is possible to carry out a preferential deposit on the areas more thermally affected vis-à-vis areas less thermally affected, in such a way that the nanostructuring is topographical.

As a variant, it is possible to create a deposit with a phase change material base on the surface of the substrate before irradiation, this material leading to nanostructuring.

The implants can be obtained by causing a metallic material deposited beforehand on one of the surfaces of the substrate to thermally diffuse.

The method consists in removing the metallic material remaining on the surface that received the deposit, before irradiation with electromagnetic waves.

The metallic material of the implants may be created with a base of gold, titanium, aluminium, platinum, copper, tungsten, nickel or silver.

As a variant, it is possible to carry out in the substrate an ionic implantation of a species that is made to thermally diffuse in order to obtain the implants.

The species implanted may be selected from gold, titanium, aluminium, copper, platinum, tungsten, nickel, silver or a doping agent of the crystalline material.

It is possible to conduct a step for homogeneous heating of the substrate before and/or during irradiation, deposit or attack in order to promote migration of the species and promote chemical attack.

The exfoliation may lead to a deposit of exfoliated material on the surface of the substrate. It is then possible to provide a step for the removal of the exfoliated material by brushing, chemical or megasonics cleaning.

As a variant, it is possible to coat the surface of the substrate with a sacrificial layer in such a way that, at the time of exfoliation, exfoliated matter is deposited on the sacrificial layer, and then to eliminate the sacrificial layer as well as the exfoliated material deposited on it.

The crystalline material of the components may be selected from silicon, III-V materials such as gallium arsenide, indium arsenide or aluminium nitride, II-VI materials such as tellurium of cadmium or zinc selenide, or germanium, gallium nitride, germanium-silicon $Si_xGe_y$, silicon carbide, indium phosphide, sapphire, quartz, garnets and diamond.

One of the components is more preferably a film which is on the side of the surface of the substrate provided with the nanostructuring, which makes it possible for the dislocations to be close to one of the surfaces of the substrate.

The electromagnetic waves may be pulsed or continuous.

The electromagnetic waves may be monochromatic or quasi-monochromatic or comprise one or more wavelengths. When they comprise several wavelengths, these may be emitted at the same time or successively, the electromagnetic waves then being subdivided into several parts corresponding to the different wavelengths, these parts having equal or different intensities.

The periodic nanostructuring method may be carried out under a controlled atmosphere or within a liquid in such as way as to control exfoliation and/or facilitate structuring.

This invention also relates to a method for nanostructure production which includes a step for the deposit of a material on a substrate provided with nanostructuring obtained by the method thus characterised.

In the case of nanostructuring formed from areas thermally affected and from areas less thermally affected, the deposit of the nanostructures may be done, for example, by a molecular jet making use of a different rate of growth between said areas.

BRIEF DESCRIPTION OF THE DRAWINGS

This invention will be better understood upon reading the description of examples of embodiments given, purely for information and in no way restrictive, referring to the appended drawings in which.

Identical, similar or equivalent parts of the various figures described below bear the same numerical references so as to facilitate the passage from one figure to the other.

The various parts shown in the figures are not necessarily shown according to a uniform scale, in order to make the figures more legible.

DETAILED PRESENTATION OF SPECIFIC EMBODIMENTS

Figure 1A:
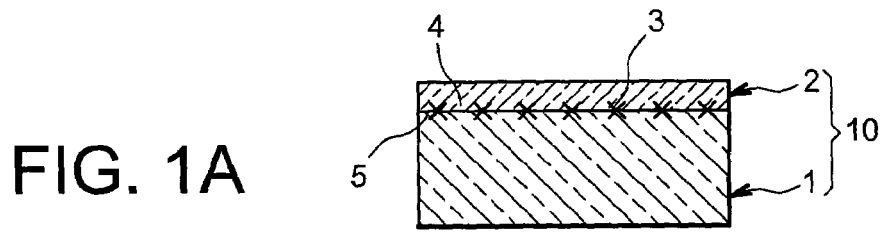
FIGS. 1A to 1G show different steps in an example of a method according to the invention.

Referring to FIGS. 1A to 1G, an example of the method according to the invention will now be described. We start with a substrate 10 possessing an embedded network of dislocations 3. This substrate 10 may be obtained, for example, as described in patent application FR-A-2 766 620. It is possible, for example, to begin by bonding, by molecular adhesion, a monocrystalline material surface of a first component 1 against a monocrystalline material surface of a second component 2. This is done in a way that the two surfaces present crystalline networks shifted in rotation and/or flexion and/or a mesh parameter discordance, in such a way as to cause the appearance of this network of dislocations 3 within a crystalline area 4 located in the neighbourhood of bonding interface 5. The starting substrate 10 is illustrated in FIG. 1A. One of components 2 may be thinner than the other, it may more preferably involve a thin crystalline film with, for example, a thickness less than approximately 10 micrometers. It is possible that, at the time of bonding, there is no thin film but that this is obtained later by the thinning of the corresponding component.

This component may in particular be a composite substrate formed from a piling up of a support, from a boundary layer for thinning, from a thin crystalline film. It may in particular involve an SOI substrate (Anglo-Saxon acronym for semiconductor on insulator). It is possible to provide for, as in patent application FR-A-2 819 099, that the thin film be sampled, beforehand, from a crystalline base substrate, which remains of the base substrate after the sampling giving the other component. The sampling may be done by creation of a weakened embedded area obtained, for example, by ionic implantation (for example with hydrogen), in the base substrate and then fracture in the weakened area.

Figure 1B:
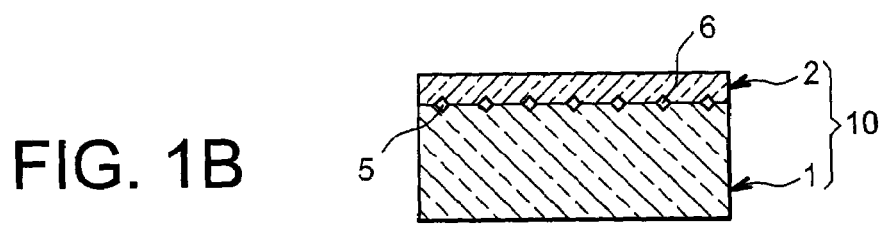

Implants 6 will then be distributed in substrate 10 in each dislocation 3 in a material different than that of crystalline area 4 in which dislocations 3 are found (FIG. 1B).

Figure 1C:
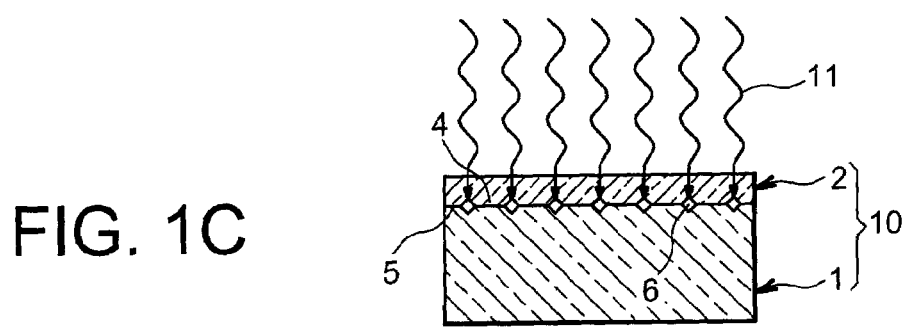

A surface of substrate 10 will be irradiated afterwards with electromagnetic waves 11 which will enter into strong interaction with implants 6 while the material of crystalline area 4 around implants 6 will be subjected to a weaker interaction. FIG. 1C can be referred to. This interaction will lead to periodic nanostructuring on the surface of substrate 10. The electromagnetic waves may be delivered by a laser (not shown). It may be continuous or preferentially in impulses. The impulses may be brief, very advantageously on the order of one or a few femtoseconds or temporally more spread out, on the order of one or a few picoseconds or of one or a few nanoseconds. In continuous mode, the same mechanisms will be found as in slow pulsed mode.

It may be monochromatic or quasi-monochromatic or alternatively possess several wavelengths. When the electromagnetic waves used for irradiation possess several wavelengths, these wavelengths may be emitted successively or simultaneously. When the electromagnetic waves used for irradiation possess several wavelengths, they are subdivided into several parts according to the different wavelengths, these parts have equal or different intensities.

It will now be explained how the periodic nanostructuring on the surface may be obtained.

Figure 1D:
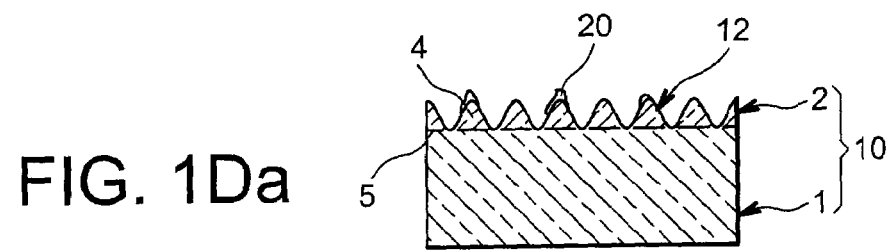
Figure 1D:
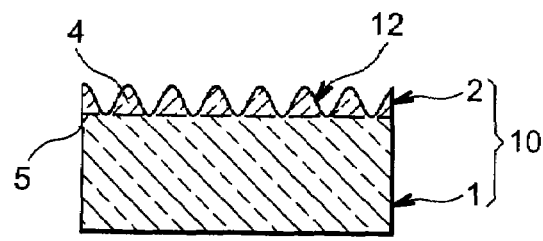

Several phenomena may occur as a function of the duration of irradiation. If this is very brief, for example is delivered by a femtosecond laser, an ablation of implants 6 occurs, leading to an exfoliation of the matter overlying implants 6 without significant heat exchange. The periodic nanostructuring 12 is topographical as illustrated in FIGS. 1Da, 1Db. It is the low irradiation duration which makes it possible to limit the thermal effects.

It is then possible to provide for a step for the removal of the exfoliated matter 20 which could be redeposited on substrate 10. In principle, implants 6 are atomised and therefore disappear; however, it is possible that only part of the implant disappears, leading to exfoliation of that which is above, and leaves intact that which is above [sic], including part of the implant.

This removal may be done by standard microelectronic techniques such as brushing, chemical and/or megasonics cleaning.

It is to be supposed that substrate 10 shown in FIG. 1Da is seen before the cleaning step. The result after cleaning is shown in FIG. 1Db.

Figure 3A:
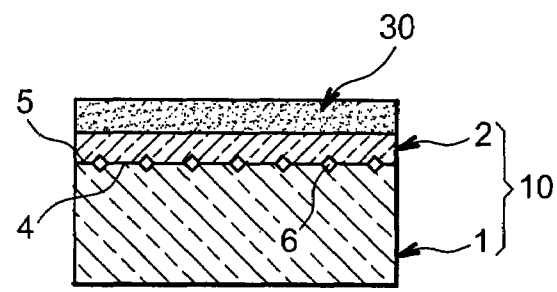
FIGS. 3A to 3E show still other steps in an example of the method of the invention.

It is possible to provide for a step for the deposit of a sacrificial layer 30 on substrate 10, on the side of its surface which will be irradiated but before irradiation (FIG. 3A). After irradiation, exfoliated matter 20 will fall back down on sacrificial layer 30. By a lift-off step, sacrificial layer 30 and the exfoliated matter which is deposited on it may be removed. A configuration similar to that of FIG. 1Db is obtained. The material of the sacrificial layer 30 may, for example, be silicon oxide.

If irradiation is prolonged, the impulses having a duration on the order of one or a few picoseconds or nanoseconds, the localised absorption of the electromagnetic waves by implants 6 creates a temperature increase in implants 6. This localised temperature increase is illustrated schematically in FIG. 1E by concentric circles. Surface nanostructuring 12 may be caused by dilation of the material of implants 6 and/or of the material of crystalline area 4 which surrounds implants 6 and consequently by the deformation of the material overlying implants 6. Nanostructuring 12 is then a topographical nanostructuring. It is formed from projections 12.1 facing implants 6. This deformation occurs first, on the surface of the substrate closest to the implants in the example described, thin film side 2, because its thickness allows the propagation of this deformation. This configuration is illustrated in FIG. 1F. The deformation may in particular be plastic, i.e. permanent or irreversible. It remains after cessation of irradiation with electromagnetic waves 11.

Figure 1E:
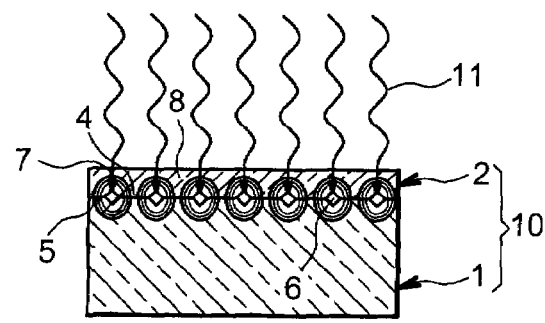
Figure 1F:
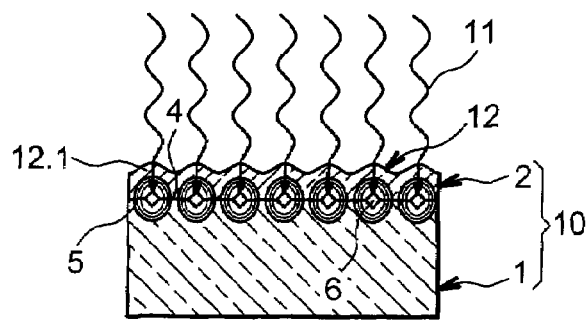
Figure 1G:
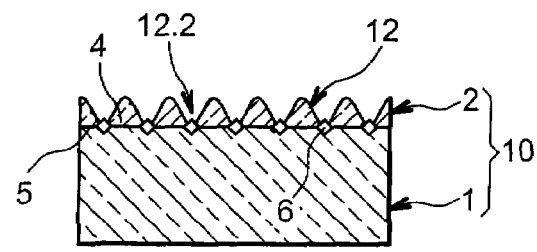

The deformation may even lead to an exfoliation of the material underlying implants 6 as illustrated in FIG. 1G. If is formed then from cavities 12.2 facing implants 6.

The temperature increase is inhomogeneous in implants 6 and in the crystalline area 4 between the implants. More thermally affected areas 7 are created (i.e. hotter areas) neighbouring areas less thermally affected 8 (i.e. areas less hot).

Figure 3B:
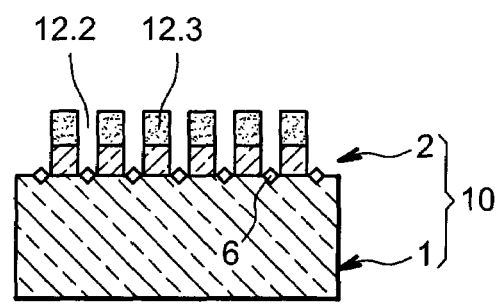

These areas are shown in FIG. 1E. It is possible that the more thermally affected areas 7 and less thermally affected areas 8 on the surface form by themselves the periodic surface nanostructuring. This nanostructuring 12 is then thermal and no longer topographic. A deposit or etching step may take place directly on the surface of substrate 10 possessing this thermal nanostructuring. An etching step is illustrated in FIG. 3B described later on.

A deposit step may be done by molecular jet. The surface temperature of the receiving substrate 10 influences the manner in which the atoms of the crystalline material that is deposited redistribute themselves. The deposit is done with growth rates that are different as a function of the temperature of the receptor area. With this deposit, a growth of nanostructures 14 as illustrated in FIG. 3E is obtained. If a material is deposited on the surface of a substrate presenting a topographical nanostructuring, as a function of the affinity between this material and the material on the surface of the substrate, the matter will naturally come to be localised in the cavities if there is a high affinity and on the raisings, if there is little affinity, in order to minimize the energy of the system.

Figure 3C:
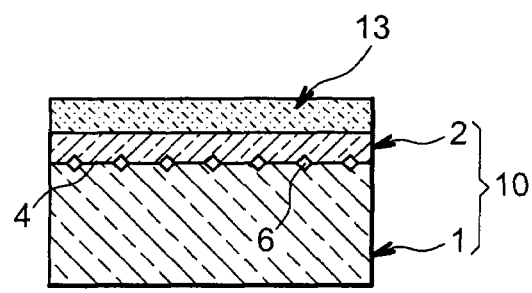
Figure 3D:
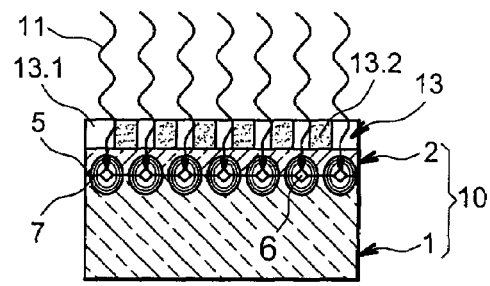
Figure 3E:
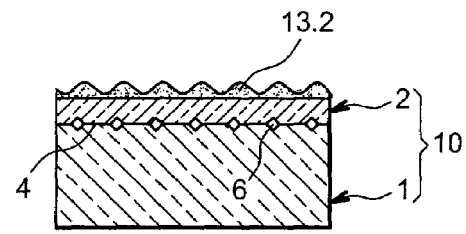

It is possible, as a variant, to deposit on substrate 10, prior to irradiation, a layer 13 of a material which will lead to the nanostructuring when irradiation has taken place as illustrated in FIG. 3C. This material may be a phase change material as a function of temperature such as GeSbTe (germanium antimony tellurium). After irradiation, a juxtaposition of amorphous areas 13.1 and crystalline areas 13.2 as illustrated in FIG. 3D is obtained. Localisation of the amorphous areas depends in fact on the thermal history of the emplacement, and on the starting state of the phase change material. In general, amorphous material is obtained when the cooling, after the rise in temperature, is rapid and crystalline material is obtained when the cooling is slow. It is therefore possible to deposit, for example, the phase change material in crystalline form, locally raise the temperature of implants 6 to a temperature sufficient to ensure the transition and descend rapidly in temperature to obtain amorphous areas in the implants. Other configurations are of course possible.

Before and/or during growth, deposit, attack or irradiation, it is possible to homogeneously heat substrate 10. This can be done in an oven, the temperature increase may be between, for example, approximately 100° C. and 600° C. This temperature increase is carried out globally. Local temperature gradients caused by irradiation add to the temperature obtained by homogeneous heating. This step cannot be shown. This step makes it possible, for example, in the case of the phase change material, to place it, before irradiation, in the neighbourhood of the transition temperature of the material. This also makes it possible to promote attack.

We will now see in more detail an example of the embodiment of the method of the invention, referring to FIGS. 2A to 2E.

Figure 2A:
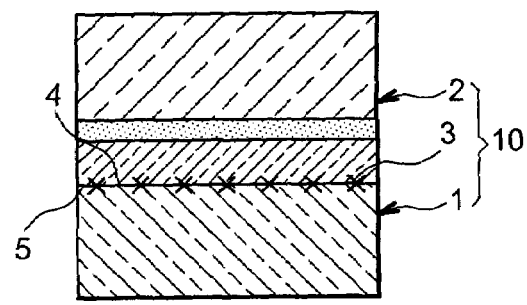
FIGS. 2A to 2E show steps of another example of the method of the invention.

We start with a substrate 10 formed from two components 1, 2, each with a crystalline material surface, these surfaces being assembled by molecular bonding, providing a rotational lag angle of 0.88° between their crystalline networks and no flexion disorientation. The crystalline material of these two components may be the same, for example silicon or it may be different. This substrate 10 may be described as "twisted" because the rotational disorientation angle is often called the angle of "twist." We are referring to FIG. 2A which shows the "twisted" substrate 10, equipped with the ordered network of dislocations 3 within a crystalline area 4 located in the neighbourhood of bonding interface 5. We assume, in the example described, that the crystalline surfaces of the two components 1, 2 are made of silicon. One of the components 1 may be a massive silicon substrate and the other component 2 a thin film. As a variant, the other component 2 can be thicker, at least at the time of assembly, comprising crystalline material on its surface to be assembled. It can be composite as illustrated in FIG. 2A. It is made to undergo a thinning step in order to keep only a thin film 2 whose thickness is, for example, approximately 10 nanometers. The thinning in order to preserve only thin film 2 can be done immediately after assembly or later, after the implant production step. This thinning step may, for example, be done by rectification, by mechanical abrasion or even by chemical abrasion.

Silicon may be used as crystalline material for one or the other of components 1, 2. It is of course possible to use other materials such as III-V materials like gallium arsenide, indium arsenide or aluminium nitride, II-VI materials such as tellurium of cadmium or zinc selenide or germanium, gallium nitride, germanium-silicon $Si_xGe_y$, silicon carbide, indium phosphide, sapphire, quartz, garnets and diamond.

Figure 2B:
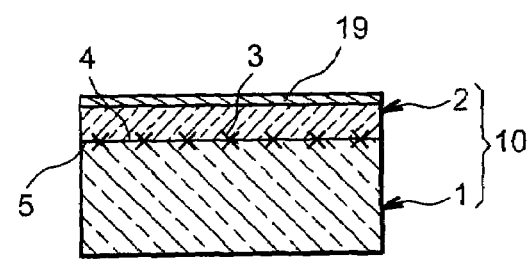

In order to construct implants 6 in dislocations 3, it is possible to deposit on the surface of the substrate 10, more preferably on the side of thin film 2, a layer 19 of metallic material capable of diffuser into the crystalline material of thin film 2 to the network of dislocations 3 and capable of strongly absorbing electromagnetic waves used subsequently. It may involve a chemical deposit in the vapour phase, an electrolytic deposit or a spraying. FIG. 2B may be referred to. The deposit could be completely constructed on the side of the massive substrate 1 to the extent that the metallic material deposited is capable of diffusing into the network of dislocations 3. The metallic material used may be constructed with a gold base, but other materials are also appropriate, such as titanium, aluminium, platinum, copper, tungsten, nickel and silver.

The thickness of layer 19 is equal to or less than approximately 15 nanometers when gold is involved. We then thermally diffuse the metallic material deposited is in the crystalline material of the crystalline area 4 so that it will reach dislocations 6 by means of application of a thermal budget with a temperature between approximately 100° C. and 1,000° C., and, for example, on the order of 500° C. for a period of time between approximately 1 minute and 10 hours, for example, for 5 hours. By diffusing into to dislocations 3, the metallic material forms implants 6.

Figure 2C:
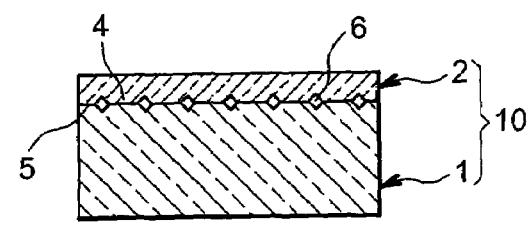

After diffusion of the metallic material, we remove what remains of metallic material layer 19 on the surface as illustrated in FIG. 2C. This removal can be done, for example, when gold or platinum is involved, with a wet chemical attack with aqua regia. It is to be recalled that aqua regia is a highly oxidising liquid formed from a mixture of hydrochloric and nitric acids. It has the property of attacking gold and all metals of the platinum family. A dry attack of the ionic type could also be used.

Figure 4:
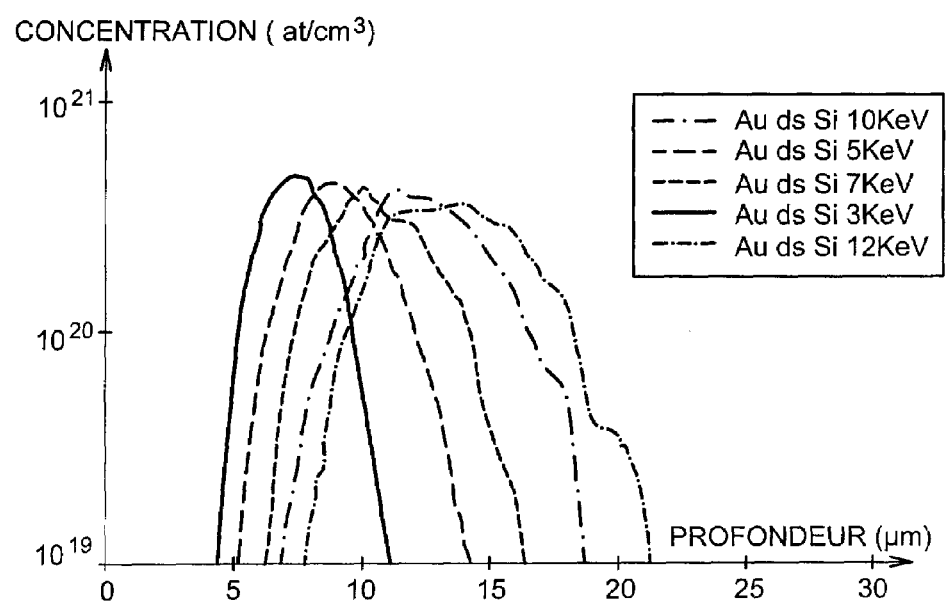
FIG. 4 illustrates the implantation profiles used to construct the implants.

As a variant, implants 6 can also be obtained by carrying out at least one ionic implantation of the species chosen to produce them, followed by thermal diffusion. The implantation is done more preferably on the side of thin film 2. The implanted species may in particular be selected from gold, titanium, aluminium, copper, platinum, tungsten, nickel, silver or doping agents of the material of thin film 2 (in the example of silicon) such as, for example, boron and arsenic. Advantageously, it is possible to spread out the implantation profile by carrying out several successive implantations at different energies as in the example of FIG. 4 in order to distribute the constraints within the structure. If too much is implanted at the same place, this could make the material locally amorphous, which is not the goal sought for. Five successive implantations of gold with energies of 3 keV, 5 keV, 7 keV, 10 keV and 12 keV have been shown in this figure. The implantation profile(s) can be located less deeply, at the same level or more deeply than dislocations 3. A thermal treatment step next makes it possible to make the implanted species diffuse, which naturally come to be localised in the dislocations in order to form the implants. Not to multiply the number of figures uselessly, FIG. 2C can completely illustrate the implants 6 obtained by ionic implantation.

Figure 2D:
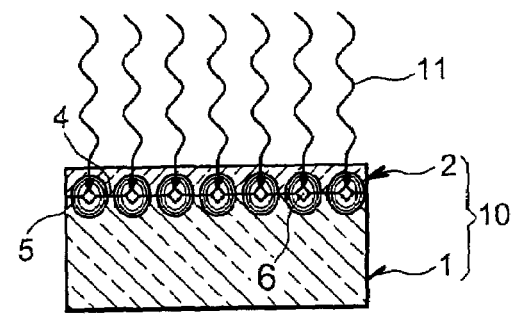

Subsequently we irradiate, as illustrated in FIG. 2D, substrate 10 from one of its principal surfaces with pulsed electromagnetic waves 11 whose impulse duration may be more-or-less long.

By using continuous or pulsed electromagnetic waves of high impulse duration (on the order of one or a few nanoseconds), the absorption of the laser energy and then the relaxation of this energy within the materials of the implants and the crystalline matter are done by standard absorption processes and then by electron-phonon relaxation on a time scale on the order of a picosecond, known by the generic name of "thermal effects." These thermal effects lead to a temperature increase, capable of reaching the vaporisation temperature of the material of the implants, indeed of the crystalline material. This vaporisation of the material may intervene on a time scale of a few nanoseconds, depending on the physical and optical properties of the irradiated material and the characteristics of the laser beam used. On account of the difference in nature between the implants and the crystalline material between these implants, temperature gradients may be localised on the surface. The nanostructuring of the surface may be induced by these temperature gradients or by the vaporisation of the implants. On account of the diffusion of heat on the surface of the material, it is advantageous to have a significant distance between the implants in order to distinguish, on the surface, the thermally affected areas from the less thermally affected areas. This distance is typically between approximately 0.1 to 1 micrometer.

By using impulses of ultra-brief duration (on the order of one or a few femtoseconds, even of one or a few picoseconds), the laser energy is absorbed, in the case of the metallic implants, by free electrons, while for the semiconductor crystalline material between the implants, the electrons are excited from the valence level, which requires that the energy of the laser photons be greater than the energy gap between the valence level and the conduction level of the crystalline material. Following irradiation of the surface by the laser of ultra-brief impulse duration, in particular by using power densities that are not too high, for which free carriers can not be created within the semiconductor crystalline material between implants 6 by processes of photo-ionisation or ionisation by electron-electron impact, hot electrons, i.e. electronic plasma, are created in implants 6, which leads to a preferential ablation of these implants 6, where the density of free carriers is the highest and therefore to the exfoliation of the crystalline areas overlying implants 6. As a function of the power density of the laser beam, the plasma can be created, preferentially in the area in which a significant free electron density results, following the appearance of a significant charge density which induces an ionisation avalanche and then a breakdown. The electrons are brought to a very high temperature by absorption of the electromagnetic waves of ultra-brief duration, compared to the crystalline network which is much less absorbent on this time-scale. This can lead to the formation of a shock-wave of hot electrons and therefore to ejection of localised matter into the areas in which the electromagnetic waves have been preferentially absorbed. It is to be noted that this technique makes it possible to minimise the coupling between the electrons and the phonons of the substrate. There is therefore little or no elevation in the average temperature of the semiconductor substrate.

Figure 2E:
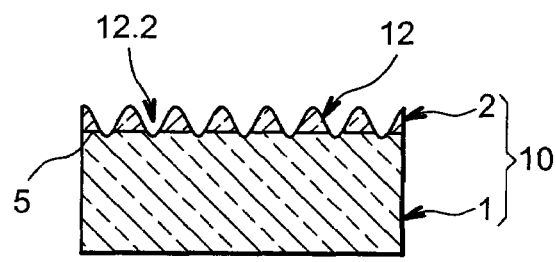

A surface nanostructuring 12 is then obtained which possess the same period and the same symmetry as those of the network of dislocations 3 of substrate 10 before treatment. This nanostructuring 12 which is topographical is illustrated in FIG. 2E. It possesses cavities 12.2 facing implants 6. It corresponds to the case in which the irradiation has been conducted with very brief impulses.

It is possible, for example, to deposit a layer of silicon oxide 30 on the surface of substrate 10, after creation of implants 6 but before irradiation as illustrated in FIG. 3A. Once irradiation is applied and exfoliation obtained, cavities 12.2 are without oxide but areas covered with oxide 12.3 remain. By etching, for example by means of a solution with a TMAH base, it is possible to accentuate the relief of cavities 12.2 obtained vis-à-vis the areas covered with oxide 12.3 which are not attacked as illustrated in FIG. 3B. We then obtain areas covered with oxide 12.3 which are separated by cavities 12.2. The oxide may be eliminated as shown above especially if at the time of irradiation exfoliated matter is deposited on the areas covered with oxide 12.3.

The method for production of the nanostructuring which has just been described may take place under a controlled atmosphere, for example, based on a vacuum, oxygen $O_2$, nitrogen $N_2$, argon Ar, helium He, hydrogen $H_2$ or within a liquid such as water or any other liquid which does not absorb the laser wavelength. This makes it possible, for example, to promote attack and control exfoliation.

Although several embodiments of this invention have been shown and described in a detailed way, it is to be understood that various changes and modifications may be brought in without leaving the framework of the invention. These various possibilities (variants) must be understood as not being mutually exclusive.

The invention claimed is:

1. A method for the production of a periodic nanostructuring on one of the surfaces of a substrate wherein the periodic nanostructuring has a periodic network of dislocations embedded within a crystalline area of the substrate located in the neighbourhood of an interface between a surface of a first crystalline material and a surface of a second crystalline material, wherein the surfaces of the first and second crystalline materials are bonded together and are in direct contact and form the substrate, the method comprising:
   forming implants in the dislocations of the second crystalline material; then
   irradiating the substrate with electromagnetic waves in order to cause absorption of electromagnetic energy in the substrate proximate to the implants, wherein the absorption leads to the appearance of periodic nanostructuring formed in the first crystalline material on the surface of the substrate.

2. The method as claimed in claim 1, wherein the periodic nanostructuring is topographical or thermal.

3. The method as claimed in claim 1, wherein the irradiating is carried out in a brief manner, in such a way as to cause an ablation of at least a part of the implants leading to an exfoliation of at least the crystalline material of the first crystalline material facing the implants, between the implants and the surface of the substrate, this ablation and exfoliation contributing to the formation of the periodic nanostructuring.

4. The method as claimed in claim 1, wherein irradiation of the substrate is carried out in a prolonged manner, in such a way as to cause a temperature increase on the irradiated surface, this temperature increase being inhomogeneous in the implants and in the first crystalline material located between the implants.

5. The method as claimed in claim 4, wherein the temperature increase causes a plastic deformation of the first crystalline material located facing the implants, between the implants and the substrate surface, wherein the deformation contributes to the formation of the nanostructuring.

6. The method as claimed in claim 4, wherein the temperature increase causes exfoliation of the first crystalline material located facing the implants, between the implants and the substrate surface, wherein the exfoliation contributes to the formation of the nanostructuring.

7. The method according to claim 4, wherein the temperature increase causes the appearance, on the substrate surface, of areas more thermally affected compared to the implants, these areas being the hottest, these areas more thermally affected bordering areas less thermally affected, these areas more thermally affected and less thermally affected being able to form the nanostructuring.

8. The method as claimed in claim 7, comprising a preferential attack on the areas more thermally affected vis-à-vis the areas less thermally affected, so as to obtain a topographical nanostructuring.

9. The method as claimed in claim 7, comprising a preferential deposit on the more thermally affected areas vis-à-vis the less thermally affected areas, so as to obtain a topographical nanostructuring.

10. The method as claimed in claim 7, further comprising a depositing, based on a phase change material, on the substrate surface before the irradiating.

11. The method as claimed in claim 1, wherein the implants are obtained by causing a metallic material, previously deposited on one of the substrate surfaces, to thermally diffuse.

12. The method as claimed in claim 11, further comprising removing the metallic material remaining on the surface that received the deposit, before the irradiating with electromagnetic waves.

13. The method as claimed in claim 11, wherein the metallic material of the implants is produced with a base of gold, titanium, aluminium, platinum, copper, tungsten, nickel or silver.

14. The method as claimed in claim 1, further comprising ionically implanting in the substrate of a species that is made to thermally diffuse in order to obtain the implants.

15. The method as claimed in claim 14, wherein the species implanted is selected from the group consisting of gold, titanium, aluminium, copper, platinum, tungsten, nickel, silver and a doping agent of the crystalline material.

16. The method as claimed in claim 1, further comprising homogeneously heating the substrate before and/or during the irradiating.

17. The method as claimed in claim 3, wherein the exfoliation leads to a deposit of exfoliated matter on the substrate surface, and wherein the method further comprises removing the exfoliated matter by brushing, chemical or megasonics cleaning.

18. The method as claimed in claim 3, further comprising coating the substrate surface with a sacrificial layer in such a way that, at the time of exfoliation, exfoliated matter is deposited on the sacrificial layer, and then eliminating the sacrificial layer and the exfoliated matter deposited on the sacrificial layer.

19. The method as claimed in claim 1, wherein the first and the second crystalline material is selected from the group consisting of silicon, III-V materials, II-VI materials, germanium, gallium nitride, germanium-silicon $Si_xGe_y$, silicon carbide, indium phosphide, sapphire, quartz, garnets and diamond.

20. The method as claimed in claim 1, wherein one of the crystalline materials is a film on the side of the substrate surface provided with the nanostructuring.

21. The method as claimed in claim 1, wherein the electromagnetic waves are pulsed or continuous.

22. The method as claimed in claim 1, wherein the electromagnetic waves are monochromatic or quasi-monochromatic or comprise one or more wavelengths, when they comprise several electromagnetic wavelengths, the latter are emitted at the same time or successively, the electromagnetic waves being then subdivided into several parts according to the different wavelengths, these parts having equal or different intensities.

23. The method as claimed in claim 1, wherein it is carried out under a controlled atmosphere or within a liquid.

24. The method as claimed in claim 8, further comprising homogeneously heating of the substrate before and/or during the depositing.

25. The method as claimed in claim 9, further comprising homogeneously heating of the substrate before and/or during attack.

26. The method for the production of nanostructures comprising depositing a material on a substrate provided with a nanostructuring obtained by the method as claimed in claim 1.

27. The method as claimed in claim 26, wherein, in the case of nanostructuring formed from areas more thermally affected and from areas less thermally affected, the deposit of the nanostructures is done by molecular jet.

28. The method as claimed in claim 19, wherein at least one of the first and the second crystalline materials is selected from the group consisting of gallium arsenide, indium arsenide, aluminium nitride, cadmium telluride and zinc selenide.

29. The method as claimed in claim 1, wherein the forming comprises ionic implantation with hydrogen at the dislocations located inside the substrate at an interface between the first and the second crystalline material.

* * * * *